United States Patent
Arai et al.

(10) Patent No.: US 8,700,979 B2
(45) Date of Patent: Apr. 15, 2014

(54) ERROR CORRECTING CODE DECODING DEVICE, DECODING METHOD, AND MOBILE STATION APPARATUS

(75) Inventors: Hiroaki Arai, Kawasaki (JP); Shunji Miyazaki, Kawasaki (JP); Kazuhisa Obuchi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/529,390

(22) Filed: Jun. 21, 2012

(65) Prior Publication Data

US 2013/0007558 A1    Jan. 3, 2013

(30) Foreign Application Priority Data

Jun. 30, 2011  (JP) .................. 2011-146149

(51) Int. Cl.
*H03M 13/03*  (2006.01)

(52) U.S. Cl.
USPC ........................................ 714/794; 714/780

(58) Field of Classification Search
USPC .................. 714/755, 758, 780, 794
See application file for complete search history.

(56) References Cited

U.S. PATENT DOCUMENTS

| | | | | |
|---|---|---|---|---|
| 5,195,107 | A * | 3/1993 | Wei .............................. | 375/290 |
| 6,182,261 | B1 * | 1/2001 | Haller et al. ................... | 714/758 |
| 6,526,539 | B1 * | 2/2003 | Yano et al. .................... | 714/794 |
| 6,629,287 | B1 * | 9/2003 | Brink ........................... | 714/755 |
| 6,662,331 | B1 * | 12/2003 | Kang ............................ | 714/755 |
| 6,795,507 | B1 * | 9/2004 | Xin et al. ...................... | 375/265 |
| 6,996,767 | B2 * | 2/2006 | Chang et al. ................... | 714/786 |
| 7,237,173 | B2 * | 6/2007 | Morita et al. .................. | 714/755 |
| 7,536,628 | B2 * | 5/2009 | Kan et al. ...................... | 714/780 |
| 7,730,378 | B2 * | 6/2010 | Li et al. .......................... | 714/755 |
| 8,015,499 | B2 * | 9/2011 | Kanaoka ........................ | 715/780 |
| 8,213,466 | B2 * | 7/2012 | Bretl et al. ..................... | 370/535 |
| 8,325,855 | B2 * | 12/2012 | Nam et al. ..................... | 375/340 |

FOREIGN PATENT DOCUMENTS

JP    2006-109272    4/2006

OTHER PUBLICATIONS

3GPP TS 36.212 V8.0.0 3rd Generation Partnership Project; Technical Specification Group Radio Access Network; Evolved Universal Terrestrial Radio Access (E-UTRA); Multiplexing and channel coding (Release 8), Sep. 2007.

* cited by examiner

*Primary Examiner* — James C Kerveros
(74) *Attorney, Agent, or Firm* — Katten Muchin Rosenman LLP

(57) ABSTRACT

An error correcting code decoding device includes a first decoding circuit, a word-length reduction circuit configured to reduce bit lengths of a first external values corresponding to a plurality of bits obtained after decoding process performed by the first decoding circuit a first predetermined number of times and to reduce bit lengths of words included in word string, and a second decoding circuit configured to decode the bit string by executing a decoding process a second predetermined number of times for calculating second external values and posterior values of the bits included in the bit string in accordance with the word string including the words having the reduced bit lengths using the first external values having the reduced bit lengths as second prior probabilities that corresponding bits among the plurality of bits are the predetermined value.

12 Claims, 9 Drawing Sheets

ERROR CORRECTING CODE DECODING DEVICE, DECODING METHOD, AND MOBILE STATION APPARATUS

CROSS-REFERENCE TO RELATED APPLICATIONS

This application is based upon and claims the benefit of priority of the prior Japanese Patent Application No. 2011-146149, filed on Jun. 30, 2011, the entire contents of which are incorporated herein by reference.

FIELD

The embodiments discussed herein are related to a decoding device which iteratively decodes an error correcting code, a decoding method, and a mobile station apparatus including such a decoding device.

BACKGROUND

In general, a turbo code, a low-density parity-check code (LDPC), a repeat accumulate (RA) code, and the like have been proposed as an error correcting code which attains a transmission speed close to a Shannon limit in a practical process. Such error correcting codes are employed in communication standards. For example, the turbo code is employed in Long Term Evolution (LTE) which is one of the communication standards standardized by Third Generation Partnership Project (3GPP) (refer to 3GPP TS 36.212 v.8.0.0, for example).

FIG. 1 is a diagram schematically illustrating a configuration of a turbo encoding device in the related art. A turbo encoding device 100 includes two encoders 101 and 102, an interleaver 103, and a multiplexer 104. An information bit string to be encoded is supplied to the encoder 101, the interleaver 103, and the multiplexer 104 in a unit of a predetermined bit length.

The encoder 101 generates a first parity bit string by performing recursive convolutional encoding on the supplied information bit string, for example. The first parity bit string is supplied to the multiplexer 104. Meanwhile, the interleaver 103 performs sorting on the supplied information bit string in accordance with a predetermined rule. The information bit string sorted by the interleaver 103 is supplied to the encoder 102. As with the encoder 101, the encoder 102 generates a second parity bit string by performing recursive convolutional encoding on the supplied bit string. Thereafter, the second parity bit string is supplied to the multiplexer 104. The multiplexer 104 multiplexes the supplied information bit string having the predetermined bit length (hereinafter referred to as a "systematic bit string") and the first and second parity bit strings with one another so as to obtain a single data block. Then the multiplexer 104 outputs the data block as a turbo code.

The turbo code, the LDPC code, and the RA code are decoded by recursively or repeatedly performing a decoding process using a decoding device. For example, the decoding device which decodes the turbo code includes a component decoder which repeatedly performs a decoding process on each predetermined amount of data (refer to Japanese Laid-open Patent Publication No. 2006-109272, for example). Japanese Laid-open Patent Publication No. 2006-109272, for example, discusses a turbo decoding device including two component decoders. One of the component decoders of the turbo decoding device calculates a first information likelihood in accordance with an information bit string and a first parity bit string which are extracted from a data block which has been subjected to turbo encoding and a first prior likelihood. On the other hand, the other component decoder obtains a second information likelihood in accordance with an information bit string obtained by interleaving the information bit string extracted from the data block, a second parity bit string which is extracted from the data block and a second prior likelihood. The first and second prior likelihoods are calculated in accordance with the second and first information likelihoods, respectively.

SUMMARY

According to an aspect of the invention, an error correcting code decoding device includes a first decoding circuit configured to execute a decoding process a first predetermined number of times for obtaining first external values of a plurality of bits included in a bit string which has been subjected to error correction encoding in accordance with a word string which corresponds to the bit string and which includes a plurality of words each of which has a bit length at least equal to or larger than two bits and first prior probabilities which are determined for individual bits and which represent probabilities that the bits have a predetermined value, the first external values representing increments of degrees of reliabilities of facts that values of the corresponding bits are the predetermined value, and each of the first external values having a bit length at least equal to or larger than two bits, a word-length reduction circuit configured to reduce bit lengths of the first external values corresponding to the plurality of bits obtained after the decoding process performed by the first decoding circuit a first predetermined number of times and to reduce bit lengths of the words included in the word string, and a second decoding circuit configured to decode the bit string by executing a decoding process a second predetermined number of times for calculating second external values and posterior values of the bits included in the bit string in accordance with the word string including the words having the reduced bit lengths using the first external values having the reduced bit lengths as second prior probabilities that corresponding bits among the plurality of bits are the predetermined value, the second external values representing increments of degrees of reliabilities of facts that values of the corresponding bits are the predetermined value, each of the second external values having a bit length at least equal to or larger than two bits, the posterior values representing increments of degrees of reliabilities of facts that values of the bits being the predetermined value, and the posterior values representing posterior probabilities that values of the bits being a predetermined value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The turbo decoding device disclosed in Japanese Laid-open Patent Publication No. 2006-109272, the two component decoders individually process bit strings having the same bit length. Therefore, sizes of circuits of the two component decoders are substantially the same as each other. Accordingly, a size of a circuit of the turbo decoding device is twice larger than the size of the circuit of each of the component decoders.

On the other hand, as the circuit size of the turbo decoding device is small, power consumed by the turbo decoding device becomes small and cost for fabrication of the turbo decoding device is reduced. Therefore, the circuit size of the turbo deciding device is preferably as small as possible. In particular, in an apparatus which includes a decoding device which decodes a bit string which has been subjected to error correction encoding included in a reception signal and which is operated by power supplied from a battery, such as cellular phones, a decoding device which consumes small electric power is preferably used.

Accordingly, an object of the present disclosure is to provide an error-correcting code decoding device of iterative processing type including a circuit having a small size.

Hereinafter, an error-correcting code decoding device according to various embodiments will be described hereinafter with reference to the accompanying drawings.

The decoding device decodes an error correcting code, such as a turbo code, by iteratively performing a decoding process. The decoding device has two decoders, and one of the decoders which is disposed in a former stage executes a decoding process on a word string corresponding to a bit string which has been subjected to error correction encoding at least once. Then bit lengths of words included in the word string representing a result of a calculation performed by the decoder in the former stage are reduced in accordance with a predetermined rule before the word string which is the result of the calculation is supplied to the decoder in a latter stage. The decoder in the latter stage performs a decoding process at least once on the word string having the reduced bit length, and thereafter, outputs a decoded bit string. By this, a circuit size of the decoder in the latter stage is reduced.

In embodiments described below, an error correcting code to be decoded corresponds to a turbo code. However, the error correcting code to be decoded may be other error correcting codes to be decoded by an iterative decoding process, such as an LDPC code and an RA code.

Figure 2:
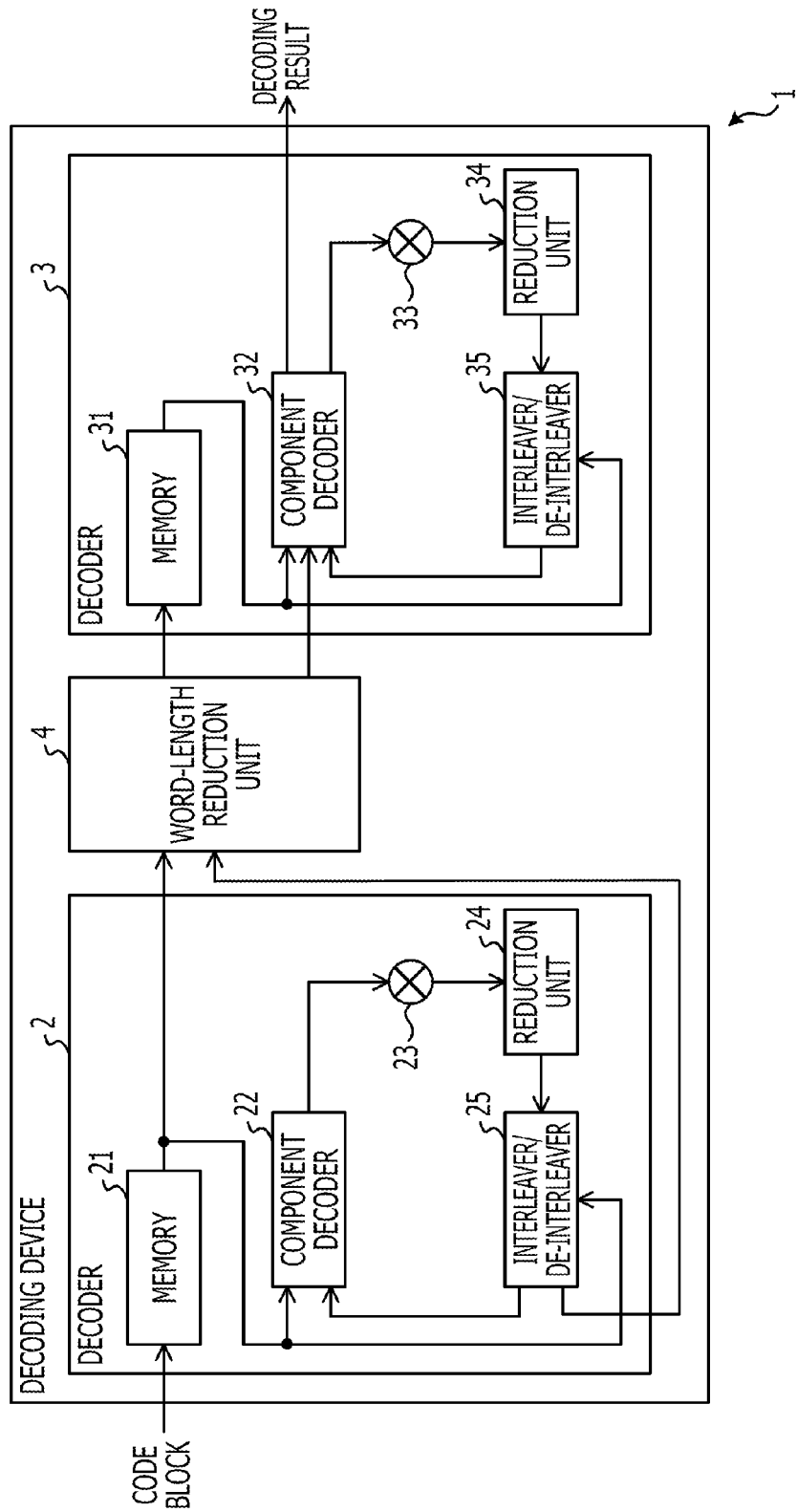
FIG. 2 is a diagram schematically illustrating a decoding device according to a first embodiment.

FIG. 2 is a diagram schematically illustrating a decoding device according to a first embodiment. A decoding device 1 includes two decoders 2 and 3 and a word-length reduction unit 4.

The components included in the decoding device 1 such as two decoders 2 and 3 and a word-length reduction unit 4 are formed as individual circuits such as an application specific integrated circuit (ASIC), for example. The components included in the decoding device 1 are implemented by a processor such as a central processing unit (CPU) or a digital signal processor (DSP) and memory, for example. Alternatively, the decoding device 1 may be realized as an integrated circuit which realizes functions of the components included in the decoding device 1.

The decoder 2 reads a word string corresponding to a bit string which has been subjected to error correction encoding in a unit of a code block and performs a decoding process on code blocks first as a decoder in a former stage. The decoder 2 performs the decoding process a predetermined number of times in a unit of a code block. The decoder 2 includes a memory 21, a component decoder 22, a multiplier 23, a reduction unit 24, and an interleaver/de-interleaver 25. Note that the predetermined number of time represents four, for example, that is, a half of the smallest number of iterations of the decoding process which attains a substantially-constant block error rate of a decoded bit string even when the decoding process is repeatedly performed on a code block.

Figure 1:
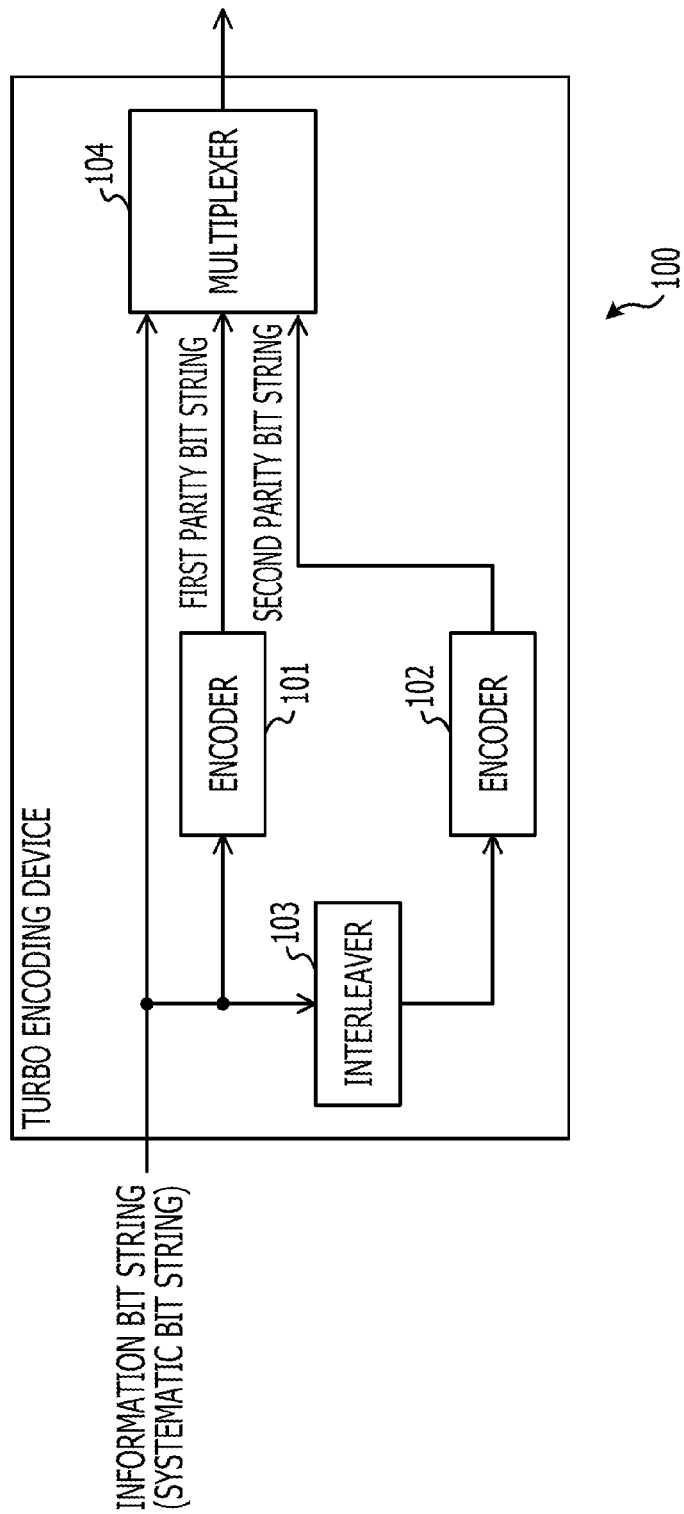
FIG. 1 is a diagram schematically illustrating a configuration of a turbo encoding device.

Here, the bit string is subjected to the error correction encoding by an error-correcting encoder, e.g., the turbo encoding device illustrated in FIG. 1, for example. Specifically, the bit string subjected to the error correction encoding includes a systematic bit string and two parity bit strings obtained in accordance with the systematic bit string. On the other hand, the word string corresponding to the bit string subjected to the error correction encoding similarly includes a word string corresponding to the systematic bit string (hereinafter referred to as a "unit word string" for convenience sake) and two word strings corresponding to the two parity bit strings (hereinafter referred to as "first and second parity word strings" for convenience sake). Each of words included in the word string corresponds to a number of bits included in the bit string which has been subjected to the error correction encoding and has a predetermined bit length equal to or larger than 2 bits. Note that a bit length for one word is determined in accordance with a specification and a configuration of an apparatus which incorporates the decoding device 1, and is 7 or 8 bits, for example. As described above, one word has a bit length equal to or larger than 2 bits since a wireless signal included in the bit string which has been subjected to the error correction encoding is degraded in a transmission from a transmission device to a reception device and therefore a value of each of the bits is represented in a multivalued manner between "0" and "1" in the reception device.

Furthermore, a size of a code block corresponds to a length of a systematic bit string to be encoded in one encoding process performed by the error correction encoding device. For example, assuming that the error correction encoding device encodes 6144 bits with a code rate of ⅓ in one encoding process and a bit length of one word is 7 bits, a size of a code block is 129024 (=6144×3×7) bits.

The memory 21 includes a volatile readable/writable memory circuit, for example. The memory 21 reads a word string from a buffer memory, not illustrated, in a unit of a code block. The memory 21 stores the code block until a decoding process performed by the decoder 2 is terminated.

The component decoder 22 reads the code block from the memory 21 and performs a decoding process a number of times on the code block. Note that the decoding process executed by the component decoder 22 is referred to as an "element decoding process" for convenience sake hereinafter to be distinguished from the decoding process performed by the decoder 2.

In odd-numbered element decoding processes, the component decoder 22 receives a unit word string and a first parity word string corresponding to a first parity bit string calculated from a corresponding systematic bit string from the memory 21.

On the other hand, in even-numbered element decoding processes, the component decoder 22 receives a unit word string which has been supplied to the interleaver/de-interleaver 25 from the memory 21 after the unit word string is sorted by the interleaver/de-interleaver 25 in accordance with a predetermined rule. Furthermore, the component decoder 22 receives a second parity word string corresponding to a second parity bit string calculated from a bit string obtained by sorting the systematic bit string in the predetermined rule. Note that the predetermined rule is the same as a rule of sorting of a systematic bit string for the calculation of the second parity bit string performed by the error correction encoding apparatus, that is, the same as the rule of the sorting executed by the interleaver 103 illustrated in FIG. 1, for example.

Furthermore, the component decoder 22 reads from the interleaver/de-interleaver 25 prior probabilities that bits included in a systematic bit string obtained in a preceding element decoding process performed by the component decoder 22 become a predetermined value in each of element decoding processes. Note that the predetermined value is "1" or "0". Furthermore, values of the prior probabilities are set to "0", for example, in the first encoding process. Furthermore, the prior probability values are also represented by a bit length equal to or larger than 2.

In this embodiment, the component decoder 22 performs the element decoding process in accordance with a Max-Log-MAP decoding method. Note that the component decoder 22 may execute the element decoding process in accordance with other methods such as a soft output Viterbi algorithm (SOYA). The component decoder 22 obtains posterior values and external values of the bits included in the systematic bit string. The posterior values represent posterior probabilities that the bits corresponding to the posterior values have the predetermined value after the systematic bit string is recognized. Each of the posterior values is represented by a Log-likelihood ratio (LLR) serving as a logarithmic value of a ratio of a posterior probability that a value of a corresponding one of the bits is "0" to a posterior probability that a value of the corresponding one of the bits is "1". Each of the posterior values is represented by an integer value of 7 or 8 bits, and the larger a posterior value becomes in a positive direction, the higher a probability that a corresponding bit value is "1" becomes, whereas the larger the posterior value becomes in a negative direction, the higher a probability that the corresponding bit value is "0" becomes. On the other hand, each of the external values serves as reliability-degree information representing an increment of reliability of a fact that a corresponding one of the bits is equal to the predetermined value.

Note that the relationship between a posterior value and an external value is generally represented by the following equation.

$$\text{Posterior Value} = \text{External Value} + \text{Channel Value} + \text{Prior Value}$$

Note that the channel value is obtained from a value of a corresponding word. Furthermore, the prior value corresponds to a prior probability that a corresponding bit becomes the predetermined value and is determined in accordance an external value obtained by a preceding element decoding process.

Note that the component decoder 22 may obtain only the external values.

After the component decoder 22 performs successive two element decoding process on a code block, a single decoding process performed by the decoder 2 is terminated. The external values calculated by the component decoder 22 are supplied to the multiplier 23.

The multiplier 23 multiplies the external values of the bits included in the systematic bit string which are supplied from the component decoder 22 by a predetermined coefficient referred as a scaling factor. The scaling factor is larger than 0 and smaller than 1, that is, the scaling factor may be 0.5, 0.75, 0.9, or the like. By multiplying the external values by the scaling factor, error correcting capability of the decoder 2 is improved. Thereafter, the external values are output from the multiplier 23 and input to the reduction unit 24.

Bit lengths of the external values output from the multiplier 23 may be larger than bit lengths assigned to values of the prior probabilities of the bits input to the component decoder 22. Therefore, the reduction unit 24 reduces the bit lengths of the external values supplied from the multiplier 23.

The reduction unit 24 reduces the bit lengths of the external values in accordance with a method referred to as "normalization", for example. In this case, the reduction unit 24 obtains the largest value of absolute values of the external values supplied from the multiplier 23. Then the reduction unit 24 determines whether a bit length used to represent the largest value in the external values is larger than a bit length of assigned to a prior probability. When the bit length used to represent the largest value in the external values is larger than the bit length assigned to the prior probability by $n_r$ bits (where "$n_r$" is an integer number equal to or larger than 1), the reduction unit 24 removes low $n_r$ bits of all the external values. By this, all the external values are represented by bit string having $n_f$ bits or smaller.

Alternatively, the reduction unit 24 may reduce the bit lengths of the external values in accordance with a method referred to as "clipping". In this case, the reduction unit 24 replaces external values, among the external values supplied from the multiplier 23, which have bit lengths which are used to represent absolute values of the external values and which are larger than the bit length $n_f$ by the largest absolute value represented by the bit length $n_f$ while maintaining signs of the external values.

Alternatively, the reduction unit 24 may reduce the bit lengths of the external values in accordance with a method referred to as "indexation". In this case, the reduction unit 24 determines the external values supplied from the multiplier 23 as external values $2^{n_p}-1$ when the external values are positive values. On the other hand, when the external values are negative values, the reduction unit 24 determines the external values as external values $-2^{n_p}$. Note that "$n_p$" represents a bit length used to represent the absolute values of the external values.

Furthermore, the reduction unit 24 may use a method obtained by combining two or more methods selected from among the normalization, the clipping, and the indexation. For example, after determining that the largest bit length $(n_f+n_r)$ in the external values supplied from the multiplier 23 is $(n_f+n_r)$ by clipping, the reduction unit 24 removes the low $n_r$ bits of all the external values. In this case, "$n_r$" is set in advance. For example, "$n_r$" is set to 1 or 2 bits.

As described above, the external values having the reduced bit lengths are used as prior values in the next element decoding process. Note that orders of words included in unit word strings supplied to the component decoder 22 in odd-numbered element decoding processes are different from orders of words included in unit word strings supplied to the component decoder 22 in even-numbered element decoding processes. Therefore, in order to match an order of the external values to the order of the words supplied to the component decoder 22, the external values output from the reduction unit 24 are supplied to the interleaver/de-interleaver 25.

The interleaver/de-interleaver 25 sorts external values obtained by an odd-numbered element decoding process performed by the component decoder 22 in accordance with a rule the same as that used for the sorting of the systematic bit string performed by the encoding device to obtain the second parity bit string. Note that the sorting rule is referred to as an "interleave rule" hereinafter for convenience sake.

On the other hand, the interleaver/de-interleaver 25 sorts external values obtained by an even-numbered element decoding process performed by the component decoder 22 so that the order of the external values sorted in accordance with the interleave rule is sorted again so that the original order is obtained. Note that the rule for sorting of an inverse order relative to the order obtained by the interleave rule is referred to as "de-interleave rule" for convenience sake.

Furthermore, the interleaver/de-interleaver 25 sorts the word string corresponding to the systematic bit string read from the memory 21 in accordance with the interleave rule for performing an even-numbered element decoding process to be performed by the component decoder 22.

The decoder 2 may include a control circuit, not illustrated, for example, which determines whether the interleave rule or the de-interleave rule is employed in the interleaver/de-interleaver 25, and the control circuit may count the number of executions of the element decoding process. In this case, the interleaver/de-interleaver 25 selects the interleave rule or the de-interleave rule to be employed in accordance with a control signal supplied from the control circuit which is determined in accordance with a determination as to whether an odd-numbered element decoding process or an even-numbered element decoding process is performed. Alternatively, the interleaver/de-interleaver 25 may incorporate a counter which counts the number of times the external values of the bits included in the systematic bit string are received from the reduction unit 24. In this case, the interleaver/de-interleaver 25 may determine whether the interleave rule or the de-interleave rule is employed in accordance with a determination as to whether a value of the counter is an odd number of an even number.

The external values of the bits included in the systematic bit string which are output from the interleaver/de-interleaver 25 are supplied to the component decoder 22 as prior values until the decoding process performed by the decoder 2 have been performed a predetermined number of times. Furthermore, when the component decoder 22 executes an even-numbered decoding process, the word string which is output from the interleaver/de-interleaver 25 and which is sorted in accordance with the interleave rule is also supplied to the component decoder 22.

After the decoding process performed the predetermined number of times by the decoder 2 has been completed, the interleaver/de-interleaver 25 outputs the external values sorted in accordance with the de-interleave rule to the word-length reduction unit 4.

Note that the control circuit, not illustrated, included in the decoder 2 may count the number of times the decoding process is executed in order to determine an output destination of the external values output from the interleaver/de-interleaver 25 among the component decoder 22 and the word-length reduction unit 4. In this case, when receiving a control signal representing that the decoding process has been performed a predetermined number of times from the control circuit, the interleaver/de-interleaver 25 outputs the external values to the word-length reduction unit 4, and otherwise, the interleaver/de-interleaver 25 outputs the external values to the component decoder 22. Alternatively, the interleaver/de-interleaver 25 may incorporate a counter which counts the number of times the element decoding process is executed. In this case, when a value of the counter reaches twice the maximum number of executions of decoding which is prescribed in the decoder 2, the interleaver/de-interleaver 25 outputs the external values to the word-length reduction unit 4.

The inventor recognizes a fact that, even when the decoder 3 executes the decoding process using words and prior values which are roughly quantized instead of the prior values corresponding to the words and the prior values corresponding to the words processed by the decoder 2, the error correcting capability is not degraded. This may be because, since the decoding process has been performed more than one time on the code block, the external values calculated by the decoder 2 become close to probable values to some extent relative to the corresponding bit values.

Therefore, the word-length reduction unit 4 reduces the bit lengths of the external values by removing a predetermined number of low bits of the external values corresponding to the bits included in the systematic bit string supplied from the decoder 2. Similarly, the word-length reduction unit 4 reduces the bit lengths of the words by removing a predetermined number of low bits of the words included in the unit word string and the first and second parity word strings which are supplied from the decoder 2. For example, when the bit lengths of the words are 7 bits and the bit lengths of the external values are 7 to 8 bits, the predetermined number corresponds to 1 to 4 bits. For example, the word-length reduction unit 4 removes three or four low bits so that the external values and the words which have bit lengths of 4 bits are obtained.

Thereafter, the word-length reduction unit 4 outputs the external values and the words which have the reduced bit lengths to the decoder 3.

The decoder 3 is disposed in a latter stage and executes a decoding process a predetermined number of times on the code block which has been subjected to the decoding process one or more times by the decoder 2. Note that the number of times the decoding process is performed by the decoder 3 is the same as that the number of times the decoding process is performed by the decoder 2, e.g., four times. However, the number of times the decoding process is performed by the decoder 3 may be different from the number of times the decoding process is performed by the decoder 2.

The decoder 3 includes a memory 31, a component decoder 32, a multiplier 33, a reduction unit 34, and an interleaver/de-interleaver 35. Note that the components included in the decoder 3 realize functions the same as those realized by the corresponding components included in the decoder 2. Therefore, in a description below, among the components included in the decoder 3, components different from those of the decoder 2 will be described.

The memory 31 stores the words included in the code block supplied from the word-length reduction unit 4. Therefore, bit lengths of the words stored in the memory 31 is shorter than the bit lengths of the words stored in the memory 21 included in the decoder 2.

As with the component decoder 22, the component decoder 32 executes the element decoding process in accordance with the Max-Log-MAP decoding method. The component decoder 32 obtains posterior values and external values of the bits included in the systematic bit string. Note that, in the first element decoding process performed by the component decoder 32, the external values having the bit lengths reduced by the word-length reduction unit 4 are supplied to the component decoder 32 as prior values. Accordingly, since the decoder 3 can decode the systematic bit string with reference to the result of the decoding performed by the decoder 2, an error correcting rate of the systematic bit string obtained as a result of the decoding process performed by the decoder 3 is improved.

After the decoding process is executed by the decoder 3 the predetermined number of times, the component decoder 32 performs the element decoding process once again. By this, an order of the posterior values which have been sorted in accordance with the interleave rule returns to the original order. Then the component decoder 32 decodes the systematic bit string such that posterior values which are close to "1", e.g., positive values, correspond to a bit value of "1" whereas posterior values which are close to "0", e.g., negative values, correspond to a bit value of "0".

Note that, as a modification, the component decoder 32 may decode the values of the bits included in the systematic bit string in accordance with posterior values obtained after the decoder 3 executes the decoding process a predetermined number of times. In this case, the decoder 3 may include a de-interleaver which changes the order of the decoded systematic bit string to the original order by sorting the decoded systematic bit string output from the component decoder 32 in accordance with the de-interleave rule.

As described above, the bit lengths of the external values and the words used by the decoder 3 are shorter than those used by the decoder 2. Therefore, a circuit size of the decoder 3 is smaller than that of the decoder 2.

To evaluate a reduction efficiency of the circuit size of the decoding device 1, a decoding device which includes two decoders 2 and which performs error correction decoding at the same speed as the decoding device 1 is virtually defined. In this decoding device, the decoders 2 independently decode a systematic bit string included in a code block. In this case, it is assumed that bit lengths of words of the code block supplied to the decoders 2 are denoted by "$n_{i1}$" whereas bit lengths of external values output from the component decoder 22 are denoted by "$n_{f1}$". Meanwhile it is assumed that bit lengths of words of a code block supplied to the decoder 3 are denoted by "$n_{i2}$" whereas bit lengths of external values output from the component decoder 32 are denoted by "$n_{f2}$". Accordingly, a rate Δ of the reduction of the circuit size of the decoding device 1 relative to the decoding device having the two decoders 2 is represented by the following equation.

$$\Delta = \frac{\text{Max}((n_{i1}+1), n_{1f}) + 1 + \text{Max}((n_{i2}+1), n_{f2}) + 1}{2 \times (\text{Max}((n_{i1}+1), n_{f1}) + 1)} \times 100(\%) \quad (1)$$

Here, a function Max(a, b) is used to output a larger value between variables a and b. Assuming that equations "$n_{i1}=7$", "$n_{f1}=8$", "$n_{i2}=4$", and "$n_{f2}=5$" are satisfied, the rate Δ is equal to 83.3%.

Figure 3:
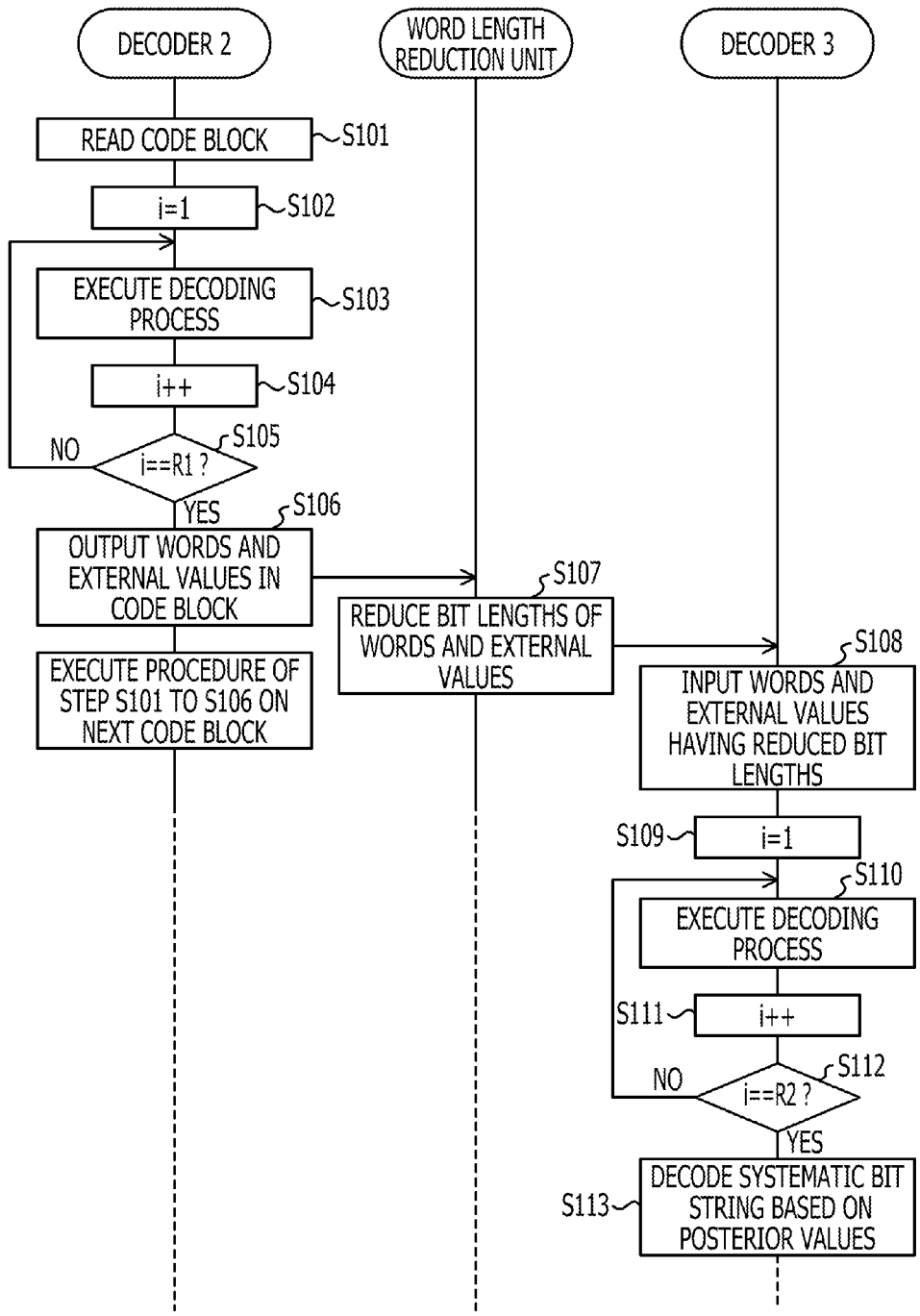
FIG. 3 is a diagram illustrating an operation sequence of an error correction decoding process performed by the decoding device according to the first embodiment.

FIG. 3 is a diagram illustrating an operation sequence of an error correction decoding process performed by the decoding device 1.

The decoder 2 reads a code block and stores the code block in the memory 21 (in step S101). The decoder 2 sets the number of repetition times i to "1" (in step S102). Thereafter, the decoder 2 executes the decoding process (in step S103). Specifically, the component decoder 22 performs the element decoding process twice. Thereafter, the decoder 2 increments the number of repetition times i by one (in step S104). The decoder 2 determines whether the number of repetition times i has reached a predetermined number of times R1 (in step S105). When the number of repetition times i has not reached the predetermined number of times R1 (that is, when the determination is negative in step S105), the decoder 2 repeatedly performs the process in step S103 onwards. On the other hand, when the number of repetition times i has reached the predetermined number of times R1 (that is, when the determination is affirmative in step S105), the decoder 2 outputs words included in the code block and external values calculated by the component decoder 22 (in step S106).

When receiving the words and the external values from the decoder 2, the word-length reduction unit 4 reduces bit lengths of the words and the external values (in step S107). Thereafter, the word-length reduction unit 4 outputs the words and the external values which have the reduced bit lengths.

The words and the external values having the reduced bit lengths are supplied to the decoder 3 (in step S108). The decoder 3 sets the number of repetition times i to "1" (in step S109). Thereafter, the decoder 3 executes the decoding process (in step S110). Specifically, the component decoder 32 performs the element decoding process twice. Thereafter, the decoder 3 increments the number of repetition times i by one (in step S111). The decoder 3 determines whether the number of repetition times i has reached a predetermined number of times R2 (in step S112). When the number of repetition times i has not reached the predetermined number of times R2 (that is, when the determination is negative in step S112), the decoder 3 repeatedly performs the process in step S110 onwards. On the other hand, when the number of repetition times i has reached the predetermined number of times R2 (that is, when the determination is affirmative in step S112), the decoder 3 decodes the systematic bit string in accordance with posterior values (in step S113).

Note that the decoder 2 executes the process from step S101 to step S106 on the next code block while the decoder 3 executes the process from step S108 to step S113. As described above, the decoder 2 and the decoder 3 execute the decoding processes on a number of code blocks as a pipeline process.

As described above, the decoding device according to the first embodiment decodes the error correcting code by the decoder in the latter stage using the external values obtained when the decoder in the former stage performs the decoding as prior values. In this case, since the decoding device removes the bit lengths of the words and the external values to be supplied to the decoder in the latter stage, the circuit size of the decoder in the latter stage can be made smaller than that of the decoder in the former stage. Furthermore, since the decoding device executes the decoding process on a number of code blocks as a pipeline process, a calculation speed is improved. As a result, the decoding device attains a calculation speed substantially the same as that of a decoding device which decodes an error correcting code using two decoders in parallel and attains a small sized circuit.

Next, a decoding device according to a second embodiment will be described.

When a decoder in a former stage and a decoder in a latter stage repeatedly perform decoding processes a predetermined number of times on a code block, a degree of improvement of a block error rate of a decoded systematic bit string corresponding to the code block becomes small. Therefore, a sum of the number of executions of the decoding process performed by the decoder in the former stage and the number of executions of the decoding process performed by the decoder in the latter stage are preferably set to the predetermined number of times. Here, the predetermined number of times is referred to as a "maximum repetition count" for convenience sake.

Furthermore, the inventor recognizes that, when the decoding device executes the decoding process on a number of blocks, an average value of the number of repetitions of the decoding process performed for appropriately decoding the systematic bit string becomes smaller than the maximum repetition count.

Therefore, the decoding device according to the second embodiment determines, every time the decoder in the latter stage performs the decoding process, whether the systematic bit string included in the code block has been appropriately decoded. Then the decoder in the latter stage terminates the decoding process performed on the code block when it is determined that the systematic bit string has been appropriately decoded and notifies the decoder in the former stage of the fact. When receiving the notification representing that the decoding process has been terminated from the decoder in the latter stage, the decoder in the former stage outputs words and external values of a code block which is currently subjected to the decoding process. By this, the decoding device according to the second embodiment attains reduction of a period of time used for a calculation executed in the decoding process performed on a number of code blocks.

Figure 4:
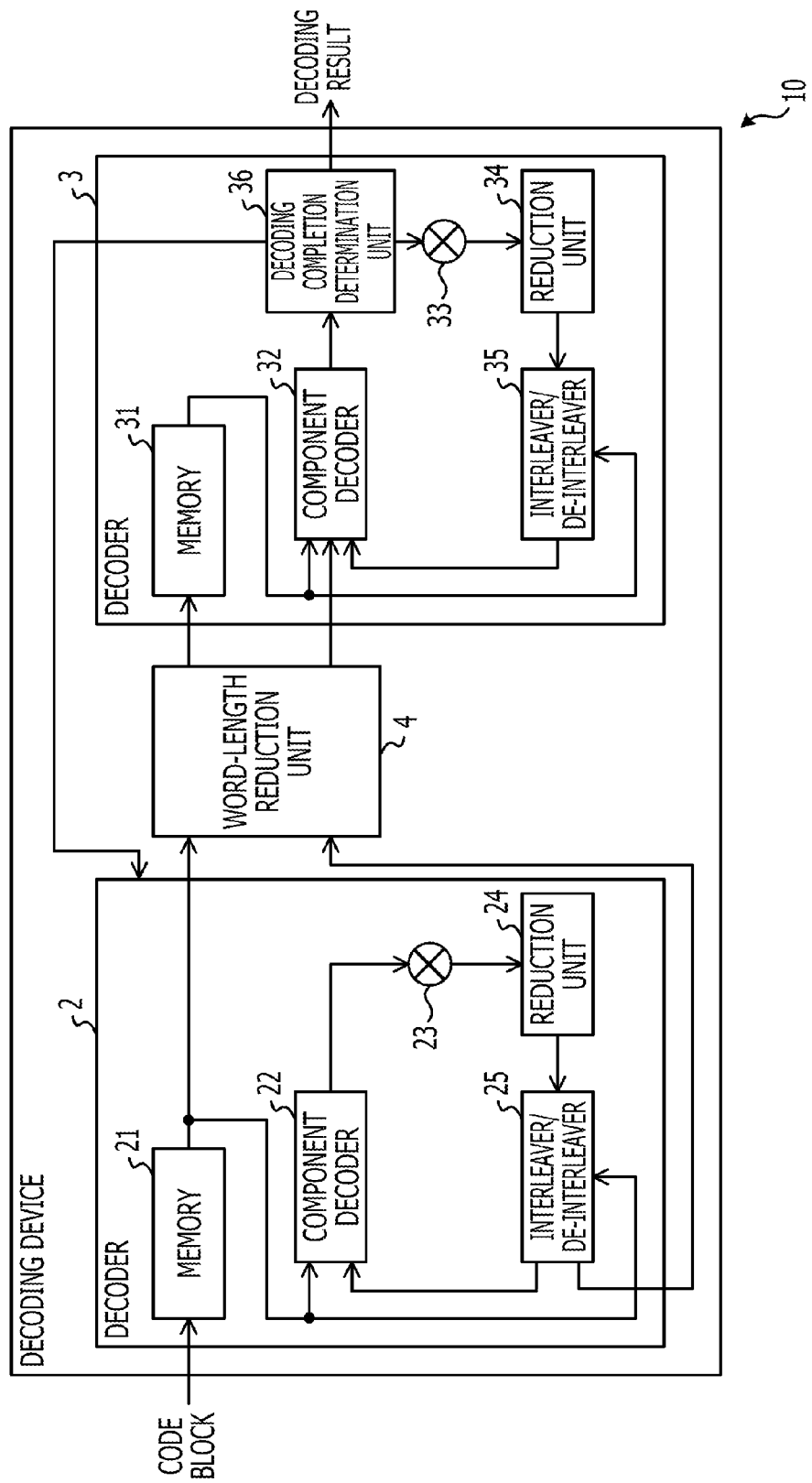
FIG. 4 is a diagram schematically illustrating a decoding device according to a second embodiment.

FIG. 4 is a diagram schematically illustrating the decoding device according to the second embodiment. As with the decoding device 1 according to the first embodiment, a decoding device 10 according to the second embodiment includes two decoders 2 and 3 and a word-length reduction unit 4. Note that, in FIG. 4, components included in the decoding device 10 are denoted by reference numerals the same as those of the decoding device 1 according to the first embodiment illustrated in FIG. 2.

Note that the decoding device 10 is different from the decoding device 1 of the first embodiment in that the decoder 3 includes a decoding completion determination unit 36. Therefore, the decoding completion determination unit 36 will be described hereinafter.

The components included in the decoding device 10 such as two decoders 2 and 3 and a word-length reduction unit 4 are formed as individual circuits such as an application specific integrated circuit (ASIC), for example. The components included in the decoding device 10 are implemented by a processor such as a central processing unit (CPU) or a digital signal processor (DSP) and memory, for example. Alternatively, the decoding device 1 may be realized as an integrated circuit which realizes functions of the components included in the decoding device 10.

In the second embodiment, a systematic bit string coded by an error correcting coding apparatus includes an information bit string representing information and a parity bit string for error correction performed on codes other than turbo codes or for error detection which is added to the information bit string. The parity bit string corresponds to a cyclic redundancy check (CRC) code, for example.

A component decoder 32 supplies posterior values and external values to the decoding completion determination unit 36 every time a decoding process is performed a number of times smaller than the maximum number of times the decoding process is executed by the decoder 3, for example, every time a decoding process is performed once.

The decoding completion determination unit 36 decodes bits included in the systematic bit string by performing a process similar to that performed when the component decoder 32 of the first embodiment determines, in accordance with posterior values, corresponding bit values. Then the decoding completion determination unit 36 determines whether the information bit string included in the systematic bit string includes an error in accordance with the parity bit string included in the decoded systematic bit string. When it is determined that the information bit string includes an error, the decoding completion determination unit 36 determines that the decoding of the systematic bit string has not been completed. Then the decoding completion determination unit 36 outputs the external values supplied from the component decoder 32 to a multiplier 33.

On the other hand, when it is determined that the information bit string does not include an error, the decoding completion determination unit 36 determines that the systematic bit string has been decoded. Furthermore, even when the information bit string includes an error and when the number of times the decoders 2 and 3 execute the decoding processes on the code block reaches the predetermined number of times, it is determined that the systematic bit string has been decoded. Note that the decoding completion determination unit 36 may determine the number of times the decoding processes are executed on a current code block to be a sum of the number of times the decoding process is executed by the decoder 3 on a preceding code block and the number of times the decoding process is performed by the decoder 3 on the current code block. Thereafter, the decoding completion determination unit 36 outputs the decoded systematic bit string. Furthermore, the decoding completion determination unit 36 notifies the decoder 2 of completion of the decoding.

When receiving the notification representing the completion of the decoding from the decoding completion determination unit 36 of the decoder 3, the decoder 2 outputs external values obtained after the notification and words included in the code block to the word-length reduction unit 4.

Accordingly, the number of times the decoding process is performed by the decoder 2 on a cord block in a certain time point is substantially the same as the number of times the decoding process is performed by the decoder 3 on a preceding code block. Note that the decoder 2 executes the decoding process on the first code block a predetermined number of times, e.g., four times.

Figure 5:
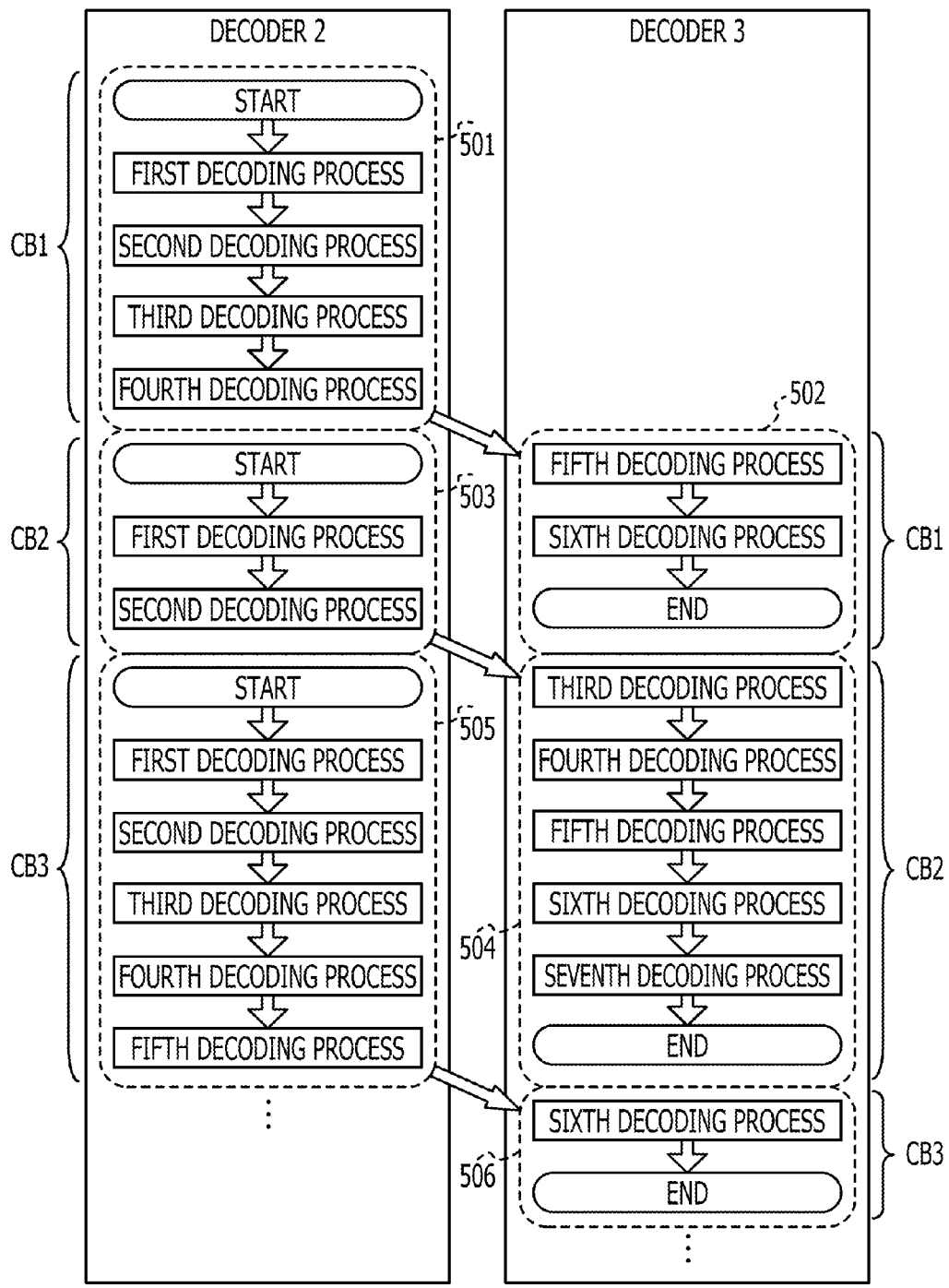
FIG. 5 is a diagram illustrating an operation sequence of decoding processes performed by two decoders included in the decoding device according to the second embodiment.

FIG. 5 is a diagram illustrating an operation sequence of the decoding processes performed by the decoders 2 and 3. Note that it is assumed that the maximum repetition count is eight in this example. First, the decoder 2 executes the predetermined decoding process four times on the first code block CB1 as illustrated in a block 501. Thereafter, words and external values of the first code block CB1 are supplied to the decoder 3. As illustrated in a block 502, after the decoder 3 performs the decoding process twice on the first code block CB1, that is, after the decoding process is performed six times in total on the first code block CB1, the decoding completion determination unit 36 determines that the decoding of a systematic bit string included in the first code block CB1 has been completed.

While the decoder 3 performs the decoding process twice on the first code block CB1, the decoder 2 executes the decoding process twice on a next code block CB2 as illustrated in a block 503. Thereafter, the decoder 2 receives a notification representing a completion of the decoding of the systematic bit string included in the first code block CB1 from the decoding completion determination unit 36 when performing the decoding process twice on the code block CB2. Then the decoder 2 outputs external values obtained at this time and words included in the code block CB2. As illustrated in a block 504, after the decoder 3 performs the decoding process five times on the second code block CB2, that is, after the decoding process is performed seven times in total on the second code block CB2, the decoding completion determination unit 36 determines that the decoding of the systematic bit string included in the second code block CB2 has been completed.

While the decoder 3 performs the decoding process five times on the second code block CB2, the decoder 2 executes the decoding process five times on a next code block CB3 as illustrated in a block 505. Thereafter, the decoder 2 receives a notification representing the completion of the decoding of the systematic bit string included in the second code block CB2 from the decoding completion determination unit 36 when the decoding process is performed five times on the code block CB3. Then the decoder 2 outputs external values obtained at this time and words included in the code block CB3. As illustrated in a block 506, after the decoder 3 performs the decoding process once on the code block CB3, that is, after the decoding process is performed six times in total on the code block CB3, the decoding completion determination unit 36 determines that the decoding of the systematic bit string included in the code block CB3 has been completed.

As described above, when the decoders 2 and 3 performs the decoding process on the plurality of code blocks, the average number of executions of the decoding process per one code block becomes smaller than the maximum repetition count. Accordingly, the decoding device according to the second embodiment attains reduction of a period of time used for a calculation for decoding a number of code blocks.

Note that, according to a modification of the second embodiment, the component decoder 22 of the decoder 2 in the prior stage may obtain posterior values in addition to external values. Furthermore, the decoder 2 may include a decoding completion determination unit which determines whether the decoding of the systematic bit string has been completed in accordance with the posterior values. Note that, as with the decoding completion determination unit 36 of the second embodiment, the decoding completion determination unit may use a parity bit string included in a systematic bit string to determine whether decoding of the systematic bit string has been completed. In this case, when the decoding completion determination unit of the decoder 2 determines that the decoding of the systematic bit string has been completed, the systematic bit string decoded by the decoding completion determination unit of the decoder 2 is directly output and the decoder 3 does not perform the decoding process on a code block corresponding to the systematic bit string. Note that it is possible that the decoder 3 in the latter stage is still performing the decoding process on a preceding code block when the decoding completion determination unit of the decoder 2 determines that decoding of a systematic bit string corresponding to a certain code block has been completed. Therefore, it is preferable that the decoding device includes a buffer which temporarily stores a systematic bit string output from the decoder 2 and outputs a systematic bit string decoded by the decoder 3 before outputting the systematic bit string stored in the buffer. By this, even when the decoder 2 in the former stage completes, while the decoder 3 in the latter stage performs a decoding process on a code block, a decoding process performed on a next code block, a decoded systematic bit string is output in accordance with an order of the code blocks.

Furthermore, according to a modification of the foregoing embodiments, a method for reducing bit lengths of external values performed by the reduction unit 24 of the decoder 2 in the former stage may be different from a method for reducing bit lengths of external values performed by the reduction unit 34 of the decoder 3 in the latter stage.

For example, the reduction unit 24 reduces word lengths of external values by one of four methods for reducing bit lengths, i.e., normalization, clipping, indexation, and a combination of the normalization and the clipping. On the other hand, the reduction unit 34 may reduces the word lengths of the external values in accordance with one of the four methods of reducing bit lengths which is other than the method employed in the reduction unit 24.

Furthermore, according to another modification of the foregoing embodiments, a scaling factor by which the external values are multiplied using the multiplier 23 of the decoder 2 in the former stage may be changed in accordance with the number of times the decoding process is performed by the decoder 2. In this case, the scaling factor is set to a positive value equal to or smaller than 1. Therefore, the decoder 2 includes a control circuit, not illustrated, for example, which supplies the scaling factor obtained in accordance with the number of times the decoding process is performed by the decoder 2 to the multiplier 23. Then the multiplier 23 multiplies the external values by the scaling factor supplied from the control circuit. Note that, also in this case, the scaling factor by which the external values are multiplied using the multiplier 33 of the decoder 3 in the latter stage may be a fixed value independently from the number of times the decoding process is performed by the decoder 3.

For example, in the multiplier 23, the larger the number of times the decoding process is performed becomes, the larger a scaling factor SF1 by which the external values are multiplied preferably becomes. On the other hand, the multiplier 33 preferably multiply the external values by a scaling factor SF2 which is equal to or larger than the maximum value of the scaling factor SF1 used in the multiplier 23 and which is equal to or smaller than 1. As the number of times the decoding process is executed increases, values of prior probabilities calculated from the external values become probable. Therefore, as the number of times the decoding process is executed increases, an error correcting capability of the decoding device is improved by obtaining the prior probabilities using values close to the external values.

Figure 6:
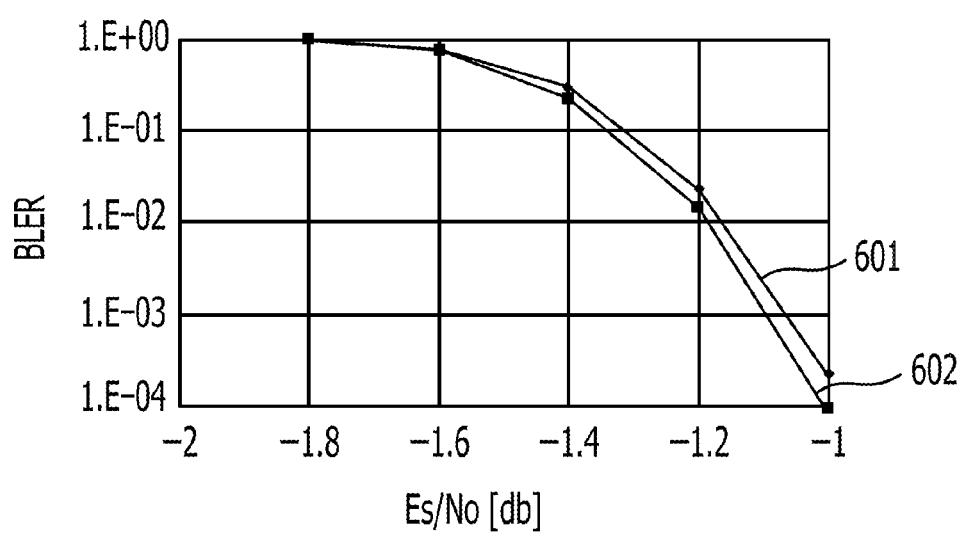
FIG. 6 is a graph illustrating a simulation result of an error correction capability of the decoding device obtained on the assumption that a value of a scaling factor of one of the decoders which is disposed in a former stage is changed and a simulation result of an error correction capability of the decoding device obtained on the assumption that values of scaling factors of the decoders are fixed.

FIG. 6 is a graph illustrating a simulation result of an error correction capability of the decoding device obtained when a value of the scaling factor SF1 is changed and a simulation result of an error correction capability of the decoding device obtained on the assumption that scaling factors SF1 and SF2 are fixed values.

In the simulations, it is assumed that an error correcting code has been transmitted from a transmission apparatus to a reception apparatus through a wireless communication, for example, and a decoding device included in the reception apparatus has performed a decoding process on the error correcting code. Furthermore, it is assumed that a length of a systematic bit string included in a code block is 3072 bits, a modulation method used in the wireless communication is quadrature phase-shirt keying (QPSK), and a code rate is ⅓. Moreover, it is assumed that each of the decoders 2 and 3 has performed the decoding process four times. An axis of abscissa in the graph represents a rate $E_s/N_0$ of a received electric power to a noise electric power in the reception apparatus, and an axis of ordinate represents a block error rate.

A polygonal line 601 in the graph represents a change of the block error rate relative to the rate Es/N0 obtained when the scaling factors SF1 and SF2 are a fixed value of 0.75. On the other hand, a polygonal line 602 in the graph represents a change of the block error rate relative to the rate Es/N0 obtained when the value of the scaling factor SF1 is changed in accordance with the number of repetitions of a decoding process. Specifically, a value of the scaling factor SF1 used in the first decoding process is set to 0.5, a value of the scaling factor SF1 used in the second and third decoding processes is set to 0.6, and a value of the scaling factor SF1 used in the fourth decoding process is set to 0.7. Furthermore, a value of the scaling factor SF2 is fixed to 0.8 irrespective of the number of times the decoding process is repeatedly performed.

As is apparent from the comparison between the polygonal lines 601 and 602 in the graph, as the number of repetitions of the decoding process increases, the error correcting capability of the decoding device is improved when the value of the scaling factor SF1 is increased and the value of the scaling factor SF2 is set equal to or larger than the maximum value of the scaling factor SF1.

Alternatively, according to the foregoing embodiments, the multiplier 33 included in the decoder 3 in the latter stage may be omitted. Accordingly, in this modification, only in the decoder 2 in the former stage, the scaling factors are multiplied when the external values are fed back to the component decoder 22. Therefore, a circuit size of the decoder 3 in the latter stage is further reduced and an electric power consumed by the decoder 3 is further reduced. Alternatively, the multiplier 23 included in the decoder 2 in the former stage and the multiplier 33 included in the decoder 3 in the latter stage may be both omitted.

Figure 7:
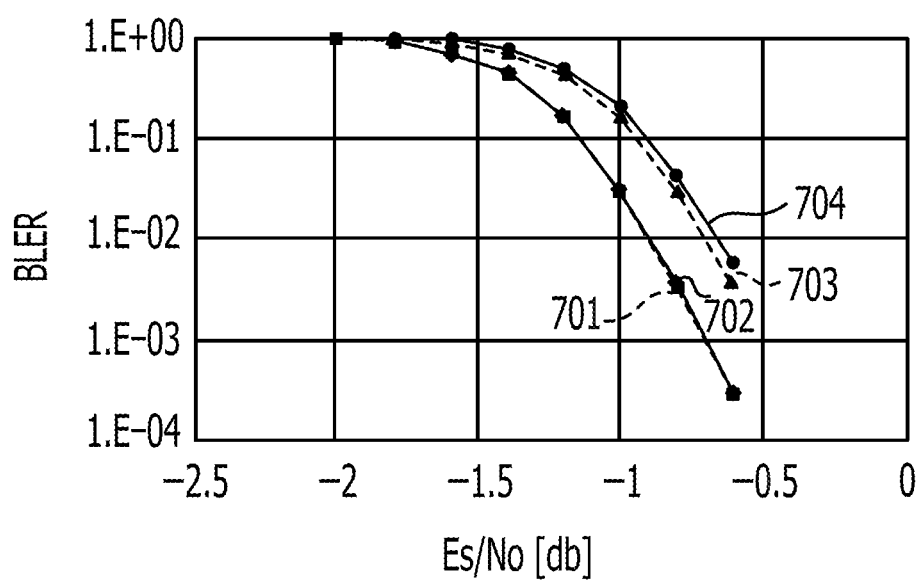
FIG. 7 is a graph illustrating a simulation result of the error correction capability of the decoding device obtained when the two decoders have respective multipliers, a simulation result obtained when only one of the decoders has a multiplier, and a simulation result obtained when the two decoders do not have multipliers.

FIG. 7 is a graph illustrating a simulation result of the error correction capability of the decoding device obtained when the two decoders have respective multipliers, a simulation result obtained when only one of the decoders have a multiplier, and a simulation result obtained when the two decoders have no multipliers.

It is assumed that, also in these simulations, an error correcting code has been transmitted from a transmission apparatus to a reception apparatus through a wireless communication, for example, and a decoding device included in the reception apparatus has performed a decoding process. Furthermore, it is assumed that a length of a systematic bit string included in a code block is 1024 bits, a modulation method used in the wireless communication is QPSK, and a code rate is ⅓. Moreover, it is assumed that each of the decoders 2 and 3 have performed the decoding process four times. An axis of abscissa in the graph represents a rate $E_s/N_0$ of a received electric power to a noise electric power in the reception apparatus, and an axis of ordinate represents a block error rate.

A polygonal line 701 in the graph represents a change of the block error rate relative to the rate $E_s/N_0$ obtained when both of the decoders 2 and 3 multiply external values by the scaling factors. A polygonal line 702 in the graph represents a change of the block error rate relative to the rate $E_s/N_0$ obtained when only the decoder 2 multiply the external values by the scaling factor SF1. Furthermore, a polygonal line 703 in the graph represents a change of the block error rate relative to the rate $E_s/N_0$ obtained when only the decoder 3 multiply the external values by the scaling factor SF2. Moreover, a polygonal line 704 in the graph represents a change of the block error rate relative to the rate $E_s/N_0$ obtained when neither the decoder 2 nor the decoder 3 multiply the external values by the scaling factors. In each of the cases, the scaling factors SF1 and SF2 are set to 0.75.

As is apparent from the polygonal lines 701 to 704 in the graph, the error correcting capability of the decoding device obtained when the external values of the decoders 2 and 3 are multiplied by the scaling factors is substantially the same as the error correcting capability of the decoding device obtained when only the external values of the decoder 2 are multiplied by the scaling factor.

Furthermore, according to still another modification of the embodiments, the word-length reduction unit 4 may reduce bit lengths of words and the external values by truncating decimal parts of values obtained by multiplying the words and the external values supplied form the decoder 2 by a coefficient of a positive value smaller than 1.

Furthermore, the word-length reduction unit 4 may reduce the bit lengths of the words and the external values by clipping or indexation similarly to reduction units included in the decoders. Alternatively, the word-length reduction unit 4 may reduce the bit lengths of the words and the external values in accordance with a reduction method obtained by combining at least two of normalization, the clipping, and the indexation. Furthermore, the word-length reduction unit 4 may use different bit-length reduction methods for the words and the external values.

According to a further modification, three or more decoders may be included in a decoding device. In this case, the decoding device includes a number of word-length reduction units corresponding to a number obtained by subtracting 1 from the number of decoders. Then, words and external values of a code block output from a decoder in an m-th stage is supplied to a decoder in an (m+1)-th stage after bit lengths of the words and the external values are reduced by one bit, for example, by a word-length reduction unit in the m-th stage (m=1 to M−1 where M represents the total number of decoders included in the decoding device).

Figure 8:
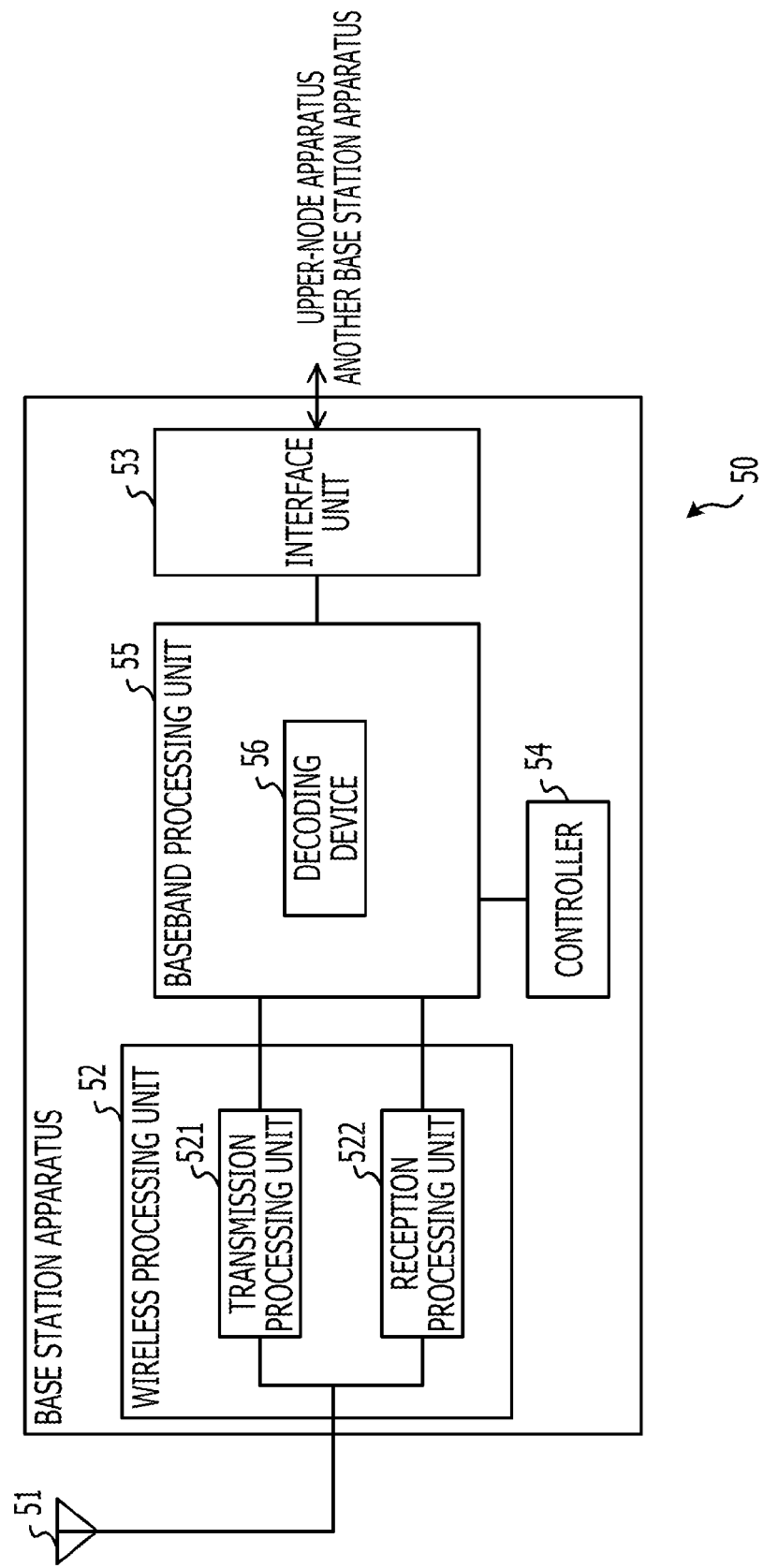
FIG. 8 is a diagram schematically illustrating a configuration of a base station apparatus including the decoding device of one of the embodiments or modifications of the decoding device.

FIG. 8 is a diagram schematically illustrating a configuration of a base station apparatus incorporating the decoding device of one of the embodiments and the modifications described above. A base station apparatus 50 includes an antenna 51, a wireless processing unit 52, an interface unit 53, a controller 54, and a baseband processing unit 55. The wireless processing unit 52 includes a transmission processing unit 521 and a reception processing unit 522. The baseband processing unit 55 includes a decoding device 56. Among these units, the wireless processing unit 52, the interface unit 53, the controller 54, and the baseband processing unit 55 are formed as individual circuits. Alternatively, the wireless processing unit 52, the interface unit 53, the controller 54, and the baseband processing unit 55 may be implemented in the base station apparatus 50 as an integrated circuit in which the circuits corresponding to the wireless processing unit 52, the interface unit 53, the controller 54, and the baseband processing unit 55 are integrated.

The antenna 51 transmits a downlink signal transmitted from the transmission processing unit 521 through a duplexer (not illustrated) as a wireless signal.

Furthermore, the antenna 51 receives an uplink signal which is a wireless signal transmitted from a mobile station apparatus, converts the uplink signal into an electric signal, and transmits the uplink signal which has been converted into the electric signal to the reception processing unit 522 through the duplexer.

The transmission processing unit 521 of the wireless processing unit 52 converts the downlink signal which is supplied from the baseband processing unit 55 and which is subjected to multiplexing into an analog signal before superposing the downlink signal on a carrier wave having a wireless frequency specified by the controller 54. The transmission processing unit 521 amplifies the downlink signal which has been superposed on the carrier wave to have a predetermined level by a high-power amplifier (not illustrated) and transmits the downlink signal to the antenna 51 through the duplexer.

The reception processing unit 522 of the wireless processing unit 52 amplifies the uplink signal supplied from the antenna 51 through the duplexer by a low-noise amplifier (not illustrated). The reception processing unit 522 converts a frequency of the uplink signal from a wireless frequency into a baseband frequency by multiplying the amplified uplink signal by a frequency signal having an intermediate frequency. The reception processing unit 522 performs an analog/digital conversion on the uplink signal having the baseband frequency before supplying the uplink signal to the baseband processing unit 55.

The interface unit 53 includes a communication interface circuit used to connect the base station apparatus 50 to an upper-node apparatus (not illustrated) and another base station apparatus (not illustrated). Then the interface unit 53 analyzes a signal supplied from the upper-node apparatus in accordance with the S1 interface so as to extract a downlink signal and a control signal included in the signal. Furthermore, the interface unit 53 analyzes a signal supplied from another base station apparatus in accordance with the X2 interface so as to extract a control signal (for example, a control signal used to execute a handover process) included in the signal. Then the interface unit 53 supplies the extracted downlink signal to the baseband processing unit 55 and supplies a control signal used to control the base station apparatus 50 to the controller 54.

On the other hand, the interface unit 53 converts the uplink signal supplied from the baseband processing unit 55 into a signal having a format based on the S1 interface and outputs the signal to the upper-node apparatus. Furthermore, the interface unit 53 converts the control signal to be transmitted to the other base station apparatus into a signal having a format based on the X2 interface. Thereafter, the interface unit 53 outputs the control signal to the other base station apparatus.

The controller 54 manages an amount of resource which is being used, the number of mobile station apparatuses which are being connected in a wireless manner, and the like for each cell set by the base station apparatus 50.

Furthermore, the controller 54 executes a process of connecting the base station apparatus 50 and the mobile station apparatus in a wireless manner. The process includes registration of a location to the mobile station apparatus which has entered a cell set by the base station apparatus 50, a call control process, and a handover process. Furthermore, the controller 54 may execute control of re-transmission of the downlink signal, order arrangement, and the like process. Moreover, the controller 54 executes selection of a modulation method and control of transmission power.

The controller 54 generates control signals used to execute these processes and supplies the signals to the baseband processing unit 55.

The baseband processing unit 55 performs a baseband process on the uplink signal and the downlink signal. The baseband processing unit 55 performs error-correction coding and the like on the downlink signal supplied from the interface unit 53. Furthermore, the baseband processing unit 55 modulates the downlink signal in accordance with a predetermined modulation method and, in addition, multiplexes the downlink signal. Note that Orthogonal Frequency-Division Multiplexing (OFDM) may be used as a multiplexing method. Then the baseband processing unit 55 supplies the downlink signal which has been modulated and multiplexed to the transmission processing unit 521 of the wireless processing unit 52.

On the other hand, the baseband processing unit 55 separates the uplink signal supplied from the reception processing unit 522 in accordance with a predetermined multiplexing method and demodulates the separated individual uplink signals. Then the baseband processing unit 55 extracts a word string corresponding to a bit string which has been subjected to error correction from the demodulated uplink signal. Thereafter, the baseband processing unit 55 supplies the word string to the decoding device 56 in a unit of a code block.

The decoding device 56 is an example of one of the foregoing embodiments and the modifications, and performs error correction decoding on the code block supplied from the baseband processing unit 55. Then the uplink signal which has been subjected to the error correction decoding is supplied to the interface unit 53.

Furthermore, the baseband processing unit 55 extracts a control signal which is referred to by the base station apparatus 50 from the uplink signal which has been subjected to the error correction decoding and supplies the control signal to the controller 54. Note that the Single Carrier Frequency Division Multiplexing (SC-FDMA) may be used as a multiplexing method for the uplink signal, for example.

Figure 9:
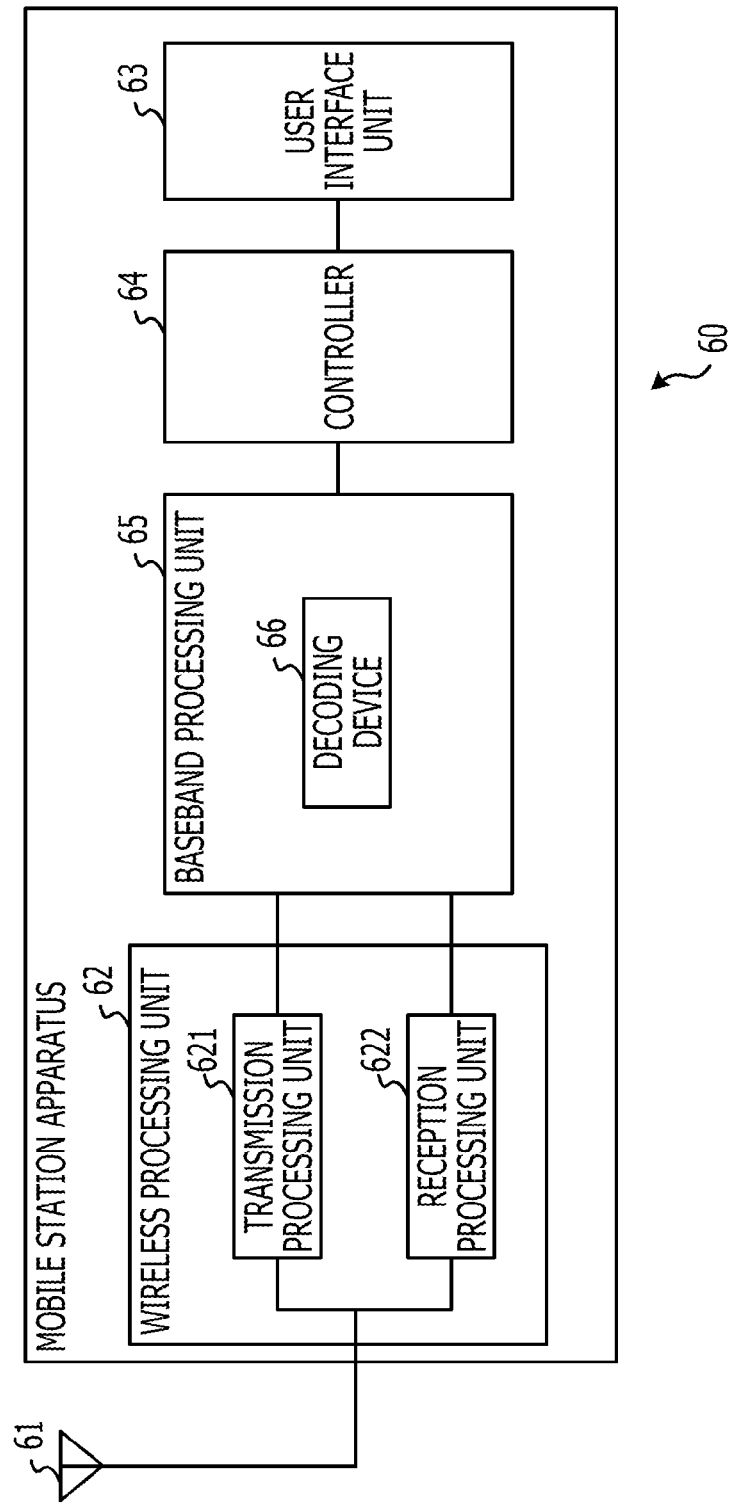
FIG. 9 is a diagram schematically illustrating a configuration of a mobile station apparatus incorporating the decoding device of one of the embodiments or the modifications of the decoding device.

FIG. 9 is a diagram schematically illustrating a configuration of a mobile station apparatus including the decoding device of one of the embodiments and the modifications described above. A mobile station apparatus 60 includes an antenna 61, a wireless processing unit 62, a user interface unit 63, a controller 64, and a baseband processing unit 65. The wireless processing unit 62 includes a transmission processing unit 621 and a reception processing unit 622. Furthermore, the baseband processing unit 65 includes a decoding device 66. The decoding device 66 corresponds to the decoding device according to one of the foregoing embodiments and the modifications. Among these units, the wireless processing unit 62, the controller 64, and the baseband processing unit 65 are formed as individual circuits. Alternatively, the wireless processing unit 62, the controller 64, and the baseband processing unit 65 may be implemented in the mobile station apparatus 60 as an integrated circuit in which the circuits corresponding to the wireless processing unit 62, the controller 64, and the baseband processing unit 65 are integrated.

Here, the wireless processing unit 62 and the baseband processing unit 65 have functions the same as those of the wireless processing unit 52 and the baseband processing unit 55 included in the base station apparatus 50 illustrated in FIG. 8, respectively, except for a multiplexing method to be employed. Therefore, a detailed description of a baseband process performed by the wireless processing unit 62 and the controller 64 are omitted.

Note that the baseband processing unit 65 multiplexes an uplink signal in accordance with the SC-FDMA method, for example. Furthermore, the baseband processing unit 65 separates a multiplexed downlink signal in accordance with the OFDMA method, for example.

The controller 64 includes one or more processors and peripheral circuits and performs a process of connecting the mobile station apparatus 60 to a base station apparatus in a wireless manner. The process includes registration of a location, a call control process, and a handover process. Therefore, the controller 64 generates a control signal used to execute a connection between the mobile station apparatus 60 and the base station apparatus in a wireless manner. Furthermore, the controller 64 performs a process in accordance with a control signal supplied from the base station apparatus.

Moreover, the controller 64 generates an uplink signal including a sound signal or data obtained through the user interface unit 63 including a microphone (not illustrated) or a keypad (not illustrated). The controller 64 performs an information-source coding process and the like on the generated uplink signal before performing a baseband process such as modulation and multiplexing on the uplink signal. Furthermore, the controller 64 performs separation, modulation, an information-source decoding process, and the like on a downlink signal supplied from the base station apparatus which is connected to the mobile station apparatus 60 in a wireless manner. Then the controller 64 extracts a sound signal, a moving image signal, or data from the decoded downlink signal. The controller 64 reproduces the extracted sound signal using a speaker (not illustrated) included in the interface unit 63 or displays a moving image signal and data in a display (not illustrated) included in the user interface unit 63.

Furthermore, the controller 64 executes various application programs implemented in the mobile station apparatus 60. All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An error correcting code decoding device comprising:
a first decoding circuit configured to execute a first decoding process a first predetermined number of times for obtaining first external values of a plurality of bits included in a bit string which has been subjected to error correction encoding in accordance with a word string which corresponds to the bit string and which includes a plurality of words each of which has a bit length at least equal to or larger than two bits and first prior probabilities which are determined for individual bits and which represent probabilities that the bits have a predetermined value, the first external values representing increments of degrees of reliabilities of facts that values of the corresponding bits are the predetermined value, and each of the first external values having a first fixed bit length at least equal to or larger than two bits;
a word-length reduction circuit configured to reduce bit lengths of the first external values corresponding to the plurality of bits obtained after the first decoding process is performed by the first decoding circuit a first predetermined number of times, from the first fixed bit length to a second fixed bit length that is shorter than the first fixed bit length, and to reduce bit lengths of the words included in the word string, from the first fixed bit length to the second fixed bit length; and
a second decoding circuit configured to decode the bit string by executing a second decoding process a second predetermined number of times for calculating second external values and posterior values of the bits included in the bit string in accordance with the word string including the words having the second fixed bit lengths using the first external values having the second fixed bit lengths as second prior probabilities that corresponding bits among the plurality of bits are the predetermined value, the second external values representing increments of degrees of reliabilities of facts that values of the corresponding bits are the predetermined value, each of the second external values having a bit length at least equal to or larger than two bits, the posterior values representing increments of degrees of reliabilities of facts that values of the bits being the predetermined value, and the posterior values representing posterior probabilities that values of the bits being a predetermined value.

2. The error correcting code decoding device according to claim 1, wherein the first decoding circuit includes
a first element decoding circuit which calculates the first external values corresponding to the plurality of bits in accordance with the first prior probabilities of the plurality of bits included in the bit string and the word string, and
a first multiplier which multiplies the individual first external values by a first scaling factor having a positive value,
the individual first external values which are multiplied by the first scaling factor are supplied to the first element decoding circuit as the first prior probabilities of corresponding bits among the plurality of bits included in the bit string, and
the first scaling factor changes in accordance with the number of times the first decoding process is performed by the first decoding circuit.

3. The error correcting code decoding device according to claim 2, wherein the first scaling factor becomes large as the number of times the first decoding process is performed by the first decoding circuit is increased.

4. The error correcting code decoding device according to claim 3, wherein the second decoding circuit includes
a second element decoding circuit which calculates the second external values and the posterior values corresponding to the plurality of bits in accordance with the second prior probabilities of the plurality of bits included in the bit string and the word string including the words having the second fixed bit lengths, and
a second multiplier which multiplies the individual second external values by a second scaling factor having a positive value,
the individual second external values which are multiplied by the second scaling factor are supplied to the second element decoding circuit as the second prior probabilities of corresponding bits among the plurality of bits included in the bit string, and
the second scaling factor is equal to or larger than the maximum value of the first scaling factor.

5. The error correcting code decoding device according to claim 1, wherein the first decoding circuit includes a first element decoding circuit which calculates the first external values corresponding to the plurality of bits in accordance with the first prior probabilities of the plurality of bits included in the bit string and the word string, a first multiplier which multiplies the individual first external values by a first scaling factor having a positive value, and a first reduction circuit which reduces bit lengths of the individual first external values which are multiplied by the first scaling factor in accordance with a first reduction method for reducing bit lengths, the individual first external values which have the reduced bit lengths are supplied to the first element decoding circuit as the first prior probabilities of corresponding bits among the plurality of bits included in the bit string, and the second decoding circuit includes a second element decoding circuit which calculates the second external values and the posterior values corresponding to the plurality of bits in accordance with the second prior probabilities of the plurality of bits included in the bit string and the word string including the words having the second fixed bit lengths, a second multiplier which multiplies the individual second external values by a second scaling factor having a positive value, and a second reduction circuit which reduces bit lengths of the individual second external values which are multiplied by the second scaling factor in accordance with a second reduction method for reducing bit lengths, the individual second external values having the reduced bit lengths are supplied to the second element decoding circuit as the second prior probabilities of corresponding bits among the plurality of bits included in the bit string, and the first reduction method and the second reduction method are different from each other.

6. The error correcting code decoding device according to claim 1, wherein the word-length reduction circuit reduces predetermined low bits of the first external values which are equal to or larger than one bit and smaller than the bit lengths of the first external values and reduces predetermined low bits of the words which are equal to or larger than one bit and smaller than the bit lengths of the words.

7. The error correcting code decoding device according to claim 1, wherein the first decoding circuit starts the first decoding process, after terminating the first decoding process performed on the word string a first predetermined number of times and before the second decoding circuit terminates the second decoding process on the word string having the second fixed bit lengths a second predetermined number of times, on another word string corresponding to another bit string which has been subjected to error correction encoding.

8. The error correcting code decoding device according to claim 1, wherein the bit string which has been subjected to the error correction encoding includes a first bit string and a parity bit string for error detection or a parity bit string for error correction obtained for the first bit string, the second decoding circuit further includes a decoding completion determination circuit which determines whether the first bit string is appropriately decoded in accordance with the parity bit string included in the decoded bit string every time the second decoding process is performed a third predetermined number of times which is smaller than the second predetermined number of times, and the second decoding circuit transmits, when the decoding completion determination circuit determines that the first bit string has been appropriately decoded, a notification prompting the first decoding circuit to terminate the first decoding process performed on another word string corresponding to another bit string which has been subjected to the error correction encoding and output the first external values obtained from the other word string to the word length reduction circuit.

9. The error correcting code decoding device according to claim 1, wherein the bit string which has been subjected to the error correction encoding includes a first bit string and a parity bit string for error detection or a parity bit string for error correction obtained for the first bit string, the first decoding circuit further includes a decoding completion determination circuit which decodes a bit string which has been subjected to the error correction encoding every time the first decoding process is performed and which determines whether the first bit string has been appropriately decoded in accordance with the parity bit string included in the decoded bit string, and the first decoding circuit outputs the decoded first bit string when the decoding completion determination circuit determines that the first bit string has been appropriately decoded.

10. The error correcting code decoding device according to claim 1, wherein the first fixed bit length and the second fixed bit length have been fixed before the first decoding process.

11. An error correcting code decoding method comprising:

executing a first decoding process a first predetermined number of times for obtaining first external values of a plurality of bits included in a bit string which has been subjected to error correction encoding in accordance with a word string which corresponds to the bit string and which includes a plurality of words each of which has a bit length at least equal to or larger than two bits and first prior probabilities which are determined for individual bits and which represent probabilities that the bits have a predetermined value, the first external values representing increments of degrees of reliabilities of facts that values of the corresponding bits are the predetermined value, and each of the first external values having a first fixed bit length at least equal to or larger than two bits;

reducing bit lengths of the first external values corresponding to the plurality of bits obtained after the first decoding process is performed a first predetermined number of times, from the first fixed bit length to a second fixed bit length that is shorter than the first fixed bit length, and to reduce bit lengths of the words included in the word string, from the first fixed bit length to the second fixed bit length; and decoding the bit string by executing a second decoding process a second predetermined number of times for calculating second external values and posterior values of the bits included in the bit string in accordance with the word string including the words having the second fixed bit lengths using the first external values having the second fixed bit lengths as second prior probabilities that corresponding bits among the plurality of bits are the predetermined value, the second external values representing increments of degrees of reliabilities of facts that values of the corresponding bits are the predetermined value, each of the second external values having a bit length at least equal to or larger than two bits, the posterior values representing increments of degrees of reliabilities of facts that values of the bits being the predetermined value, and the posterior values representing posterior probabilities that values of the bits being a predetermined value.

12. A mobile station apparatus, comprising:

an antenna configured to receive a wireless signal including a bit string which has been subjected to error correction encoding and which converts the wireless signal into an electric signal;

a baseband processing unit configured to extract a word string which corresponds to the bit string which has been subjected to the error correction encoding and which includes a plurality of words each of which has a bit length at least equal to or larger than two bits; and a decoding unit configured to decode the bit string which has been subjected to the error correction encoding in accordance with the word string, wherein the decoding unit includes a first decoder configured to execute a first decoding process a first predetermined number of times for obtaining first external values of a plurality of bits included in a bit string which has been subjected to error correction encoding in accordance with a word string which corresponds to the bit string and which includes a plurality of words each of which has a bit length at least equal to or larger than two bits and first prior probabilities which are determined for individual bits and which represent probabilities that the bits have a predetermined value, the first external values representing increments of degrees of reliabilities of facts that values of the corresponding bits are the predetermined value, and each of the first external values having a first fixed bit length at least equal to or larger than two bits;

a word-length reduction unit configured to reduce bit lengths of the first external values corresponding to the plurality of bits obtained after the first decoding process is performed by the first decoder a first predetermined number of times, from the first fixed bit length to a second fixed bit length that is shorter than the first fixed bit length, and to reduce bit lengths of the words included in the word string, from the first fixed bit length to the second fixed bit length; and a second decoder configured to decode the bit string by executing a decoding process a second predetermined number of times for calculating second external values and posterior values of the bits included in the bit string in accordance with the word string including the words having the second fixed bit lengths using the first external values having the second fixed bit lengths as second prior probabilities that corresponding bits among the plurality of bits are the predetermined value, the second external values representing increments of degrees of reliabilities of facts that values of the corresponding bits are the predetermined value, each of the second external values having a bit length at least equal to or larger than two bits, the posterior values representing increments of degrees of reliabilities of facts that values of the bits being the predetermined value, and the posterior values representing posterior probabilities that values of the bits being a predetermined value.

* * * * *